(12) United States Patent
Kim et al.

(10) Patent No.: US 7,223,661 B2
(45) Date of Patent: May 29, 2007

(54) METHOD OF MANUFACTURING SEMICONDUCTOR DEVICE

(75) Inventors: Jae Young Kim, Anyang-si (KR); Ki Won Nam, Icheon-si (KR)

(73) Assignee: Hynix Semiconductor, Inc., Icheon-Si (KR)

( * ) Notice: Subject to any disclaimer, the term of this patent is extended or adjusted under 35 U.S.C. 154(b) by 53 days.

(21) Appl. No.: 11/120,531

(22) Filed: May 2, 2005

(65) Prior Publication Data

US 2006/0141796 A1    Jun. 29, 2006

(30) Foreign Application Priority Data

Dec. 28, 2004    (KR) .................... 10-2004-0113633

(51) Int. Cl.
*H01L 21/461* (2006.01)
*H01L 21/302* (2006.01)

(52) U.S. Cl. ............... 438/294; 438/706; 257/E21.019; 257/E21.648; 257/E21.649; 257/E21.119

(58) Field of Classification Search ............... 438/294, 438/706
See application file for complete search history.

(56) References Cited

U.S. PATENT DOCUMENTS

| | | | |
|---|---|---|---|
| 6,071,783 A * | 6/2000 | Liang et al. ................ 438/301 |
| 6,350,993 B1 * | 2/2002 | Chu et al. ..................... 257/19 |
| 6,599,437 B2 * | 7/2003 | Yauw et al. ................... 216/47 |
| 6,794,230 B2 * | 9/2004 | Huang et al. ............... 438/154 |
| 7,018,930 B2 * | 3/2006 | Lee et al. .................... 438/706 |
| 2001/0034136 A1 * | 10/2001 | Kim et al. .................. 438/712 |
| 2006/0081875 A1 * | 4/2006 | Lin et al. .................... 257/190 |

* cited by examiner

*Primary Examiner*—Walter Lindsay, Jr.
*Assistant Examiner*—Thu-Huong Dinh
(74) *Attorney, Agent, or Firm*—Townsend and Townsend and Crew LLP

(57) ABSTRACT

The method includes forming an isolation film on a silicon substrate to define an active region; forming an antireflective film on an entire surface of the substrate containing the isolation film; forming a photosensitive film pattern on the antireflective film while exposing a portion of the isolation film or the active region adjacent to the isolation film; etching the antireflective film, the isolation film, and the substrate by using the photosensitive film pattern as an etching mask to recess the active region; performing a light etch treatment on a substrate resultant without removing the remaining photosensitive film pattern, so as to remove a damaged layer and a carbon pollutant formed on a surface of the recessed active region; and removing the remaining photosensitive film pattern and the antireflective film.

12 Claims, 3 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly, to a method of manufacturing a semiconductor device, which can prevent a characteristic of a gate oxide from degrading and can prevent deformation of the profile of a recess top portion and active loss of a region around a peripheral circuit during light etch treatment in the course of forming a step-gated asymmetry recess (STAR) cell.

2. Description of the Prior Art

In accordance with rapid advance of high integration of a memory semiconductor device such as a DRAM, there are problems in that a threshold voltage margin and a refresh time of a cell region are reduced in a construction of a conventional flat transistor. Several studies have been actively performed in order to secure the refresh characteristic together with a threshold voltage satisfying the requirement for the high integration of the device.

As one example of such studies, a structure of a STAR (step-gated asymmetry recess) cell has been proposed. The STAR cell has a structure in which a portion of an active region is recessed to form a stepped portion at the active region and a gate is formed at the stepped portion of the active region, thereby extending an effective channel length in a MOSFET device. According to the structure of the STAR cell, the short channel effect is reduced, so that a desired level of the threshold voltage can be obtained by a low threshold voltage dose. Also, the electric field across the MOSFET device can be lowered. Therefore, the refresh time to update data can be improved to be three times higher than the structure of the conventional flat cell.

In particular, such a STAR cell can be achieved by adding a simple step into an existing process or simply altering the existing process. Since the STAR cell is very easily applied, it has emerged as a very effective method to solve the reduction of the threshold voltage and refresh time due to the high integration of the memory semiconductor device.

A method of manufacturing the semiconductor device to form a conventional STAR cell will now be described in brief.

First, a trench type isolation film is formed in a field region of a semiconductor device to define an active region. After an antireflective film is deposited on the entire surface of the substrate, a photosensitive film pattern is formed on the antireflective film while exposing a portion of the isolation film or the active region adjacent to the isolation film.

Then, the antireflective film, the isolation film, and the active region are etched using the photosensitive film pattern as an etching mask, so that a portion of the isolation film and the active region adjacent to the isolation film are recessed through the etching. The photosensitive film pattern is removed using the etching mask, and the remaining antireflective film is then removed.

Thereafter, the resultant substrate is subjected to a light etch treatment (LET) under conditions of low voltage and in the atmosphere containing a large quantity of $O_2$ gas, thereby removing a damaged layer and a carbon pollutant formed on a surface of the substrate when the substrate is recessed.

Thereafter, a gate is formed on a stepped portion of the active region and the etched isolation film, and the substrate is subjected to source/drain ion implantation to form the STAR cell.

However, the conventional method of manufacturing the semiconductor device to form the STAR cell has the following problems.

As described above, immediately after forming the recess through etching, the substrate is subjected to a light etch treatment in order to remove the damaged layer and the carbon pollutant formed on a surface of the substrate. Since the treatment entails etching of the substrate, profile deformation is caused at a top portion of the recessed substrate, thereby varying the characteristic of the device.

If the substrate is not subjected to the light etch treatment so as to prevent the profile deformation, the characteristic of the gate oxide film to be formed during a subsequent process may be deteriorated.

FIGS. 1A and 1B are photomicrographs illustrating profiles of an active region before and after being subjected to the conventional light etch treatment.

As shown in FIGS. 1A, an edge of the active region has a round profile before performing a dry etching. It is noted that a stable device characteristic is obtained in the manufactured device.

Meanwhile, referring to FIG. 1B, the edge of the active region has a vertical profile, after performing the dry etching. It is noted that a device characteristic, such as an electric field concentrated onto the edge of the active region in the manufactured device, is deteriorated.

In addition, the light etch treatment causes the profile deformation of the recessed top portion in the cell region, and loss of the active region in the peripheral circuit. Therefore, since a process condition is additionally adjusted, it is difficult to secure a process margin.

SUMMARY OF THE INVENTION

Accordingly, the present invention has been made to solve the above-mentioned problems contained in the prior art, and an object of the present invention is to provide a method of manufacturing a semiconductor device, which can prevent a characteristic of a gate oxide from degrading and can prevent deformation of the profile of a recess top portion and active loss of a region around a peripheral circuit during light etch treatment for eliminating a damaged layer and a carbon pollutant.

In order to accomplish this object, there is provided a method of manufacturing a semiconductor device to form a STAR (step-gated asymmetry recess) cell, comprising the steps of: forming an isolation film on a silicon substrate to define an active region; forming an antireflective film on an entire surface of the substrate containing the isolation film; forming a photosensitive film pattern on the antireflective film while exposing a portion of the isolation film or the active region adjacent to the isolation film; etching the antireflective film, the isolation film, and the substrate by using the photosensitive film pattern as an etching mask to recess the active region; performing a light etch treatment on a substrate resultant without removing the remaining photosensitive film pattern, so as to remove a damaged layer and a carbon pollutant formed on a surface of the recessed active region; and removing the remaining photosensitive film pattern and the antireflective film.

The light etch treatment is performed in-situ, after recessing the active region of the substrate.

The light etch treatment is performed by utilizing a gas not containing a carbon source, preferably by utilizing a gas of $SF_6$, $NF_3$, $Cl_2$ and HBr as a main etching gas.

The light etch treatment is performed by utilizing $CF_4$ as a main etching gas and any one of $O_2$, Ar, $N_2$ and $H_2$ as a dilute gas, while applying a low power lower than 100 W.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
FIGS. 1A and 1B are photomicrographs illustrating profiles of an active region before and after being subjected to the light etch treatment.
Figure 1B:

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 2A through 2D are cross-sectional view illustrating a process of manufacturing a semiconductor device to form a STAR cell according to a preferred embodiment of the present invention.

Figure 2A:
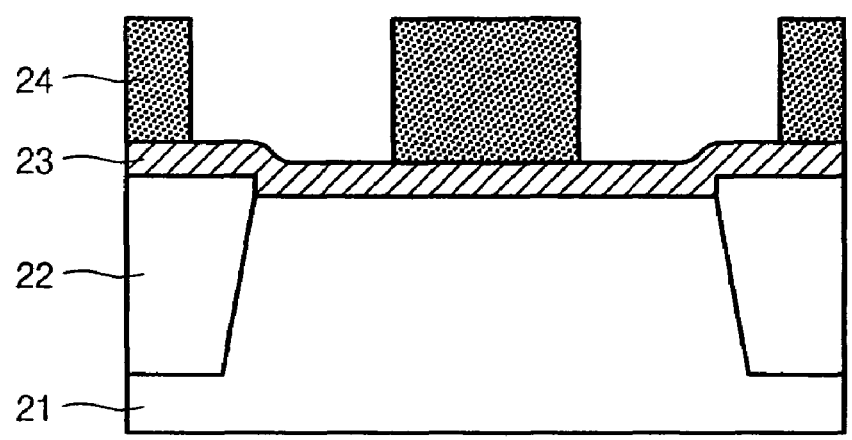
FIGS. 2A through 2D are cross-sectional view illustrating a process of manufacturing a semiconductor device to form a STAR cell according to a preferred embodiment of the present invention.

Referring to FIG. 2A, a trench type isolation film 22 is formed in a field region of a semiconductor device 21 through a known shallow trench isolation step to define an active region. Thereafter, an antireflective film 23 is deposited on the entire surface of the substrate containing the isolation film 22, and a photosensitive film pattern 24 is formed on the antireflective film 23 through a known photolithography step to expose a portion of the isolation film 22 or the active region adjacent to the isolation film.

Figure 2B:
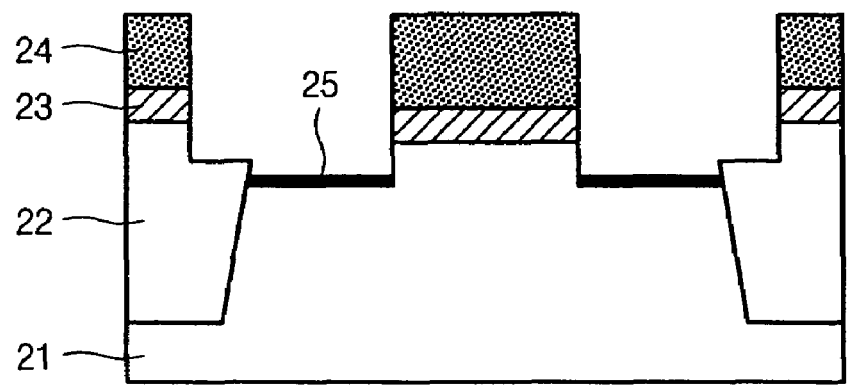

Referring to FIG. 2B, the antireflective film 23, the isolation film 22, and the active region of the substrate 21 are etched using the photosensitive film pattern as an etching mask, so that a portion of the isolation film 22 and the active region adjacent to the isolation film are recessed through the etching. As a result, a damaged layer 25 together with a defect such as carbon pollutant remains on a surface of the recessed active region of the substrate.

Figure 2C:
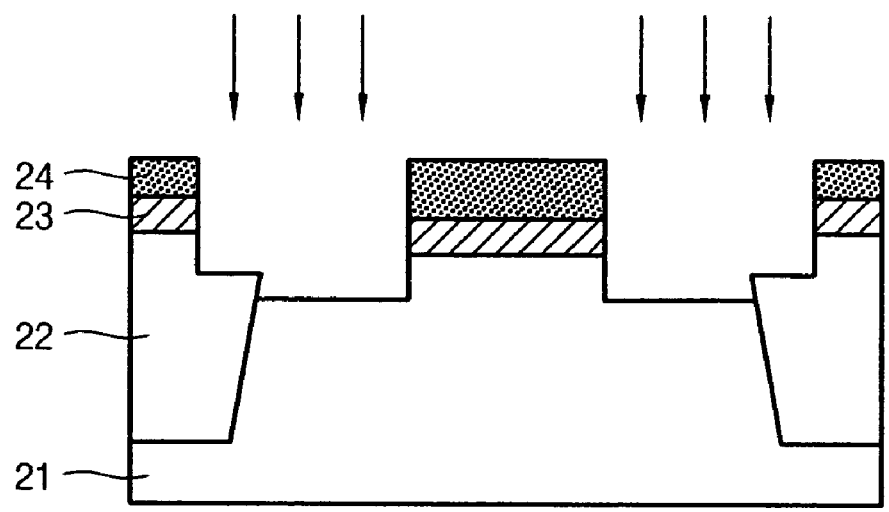

Referring to FIG. 2C, the resultant substrate is subjected to in-situ etching step, i.e., a light etch treatment, without removing the photosensitive film pattern 24. Then, the damaged layer and the carbon pollutant remaining on the surface of the recessed active region are removed. Here, the etching step utilizes a gas not containing a carbon source, for example, a gas of $SF_6$, $NF_3$, $Cl_2$ and HBr as a main etching gas. Alternatively, the etching step can utilize $CF_4$ as a main etching gas and any one of $O_2$, Ar, $N_2$ and $H_2$ as a dilute gas, while applying a low power of up to 100 W.

Since the etching step is performed without eliminating the photosensitive film pattern 24, the photosensitive film pattern serves as an etching barrier. Therefore, a recess top portion is not etched to prevent the profile deformation of the recess top portion. In addition, since a region of a peripheral circuit is covered by the photosensitive film pattern, it prevents the loss of the active region of the substrate in the peripheral circuit. As a result, it is unnecessary to set or adjust a new process condition. In addition, the etching step can effectively remove the damaged layer, so that characteristic of a gate oxide to be formed in a following step is equally maintained as the case where the substrate recess etching is not performed.

Meanwhile, although the etching step is performed in-situ after the substrate recess etching in the above process, the substrate may be moved into another chamber to be subjected to the etching step, without removing the photosensitive film pattern.

Figure 2D:
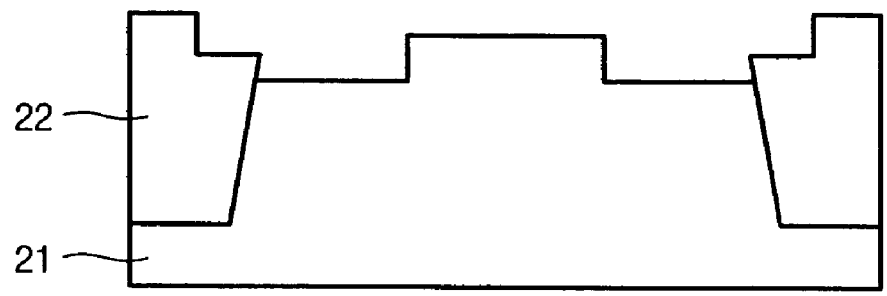

Referring to FIG. 2D, the resultant substrate is subjected to a photosensitive film stripping process to remove the photosensitive film pattern, and is then subjected to a cleaning process to remove the antireflective film.

Although not shown herein, the substrate is sequentially subjected to following steps containing a gate forming step and a source/drain region forming step, so as to manufacture the semiconductor device having the STAR cell.

According to the present invention as described above, the light etch treatment is performed without removing the photosensitive film pattern already used as the etching mask in the substrate recess etching. Therefore, the present invention can prevent the profile deformation of the recess top portion and the loss of the active region of the substrate in the peripheral circuit. Also, the characteristic of the gate oxide is equally maintained as the case where the substrate recess etching is not performed. As a result, the present invention can achieve the high-integrated memory semiconductor device having a desired device characteristic by stably adopting the STAR cell.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device to form a STAR (step-gated asymmetry recess) cell, comprising the steps of:

forming an isolation film on a silicon substrate to define an active region;

forming an antireflective film on an entire surface of the substrate containing the isolation film;

forming a photosensitive film pattern on the antireflective film while exposing a portion of the isolation film or the active region adjacent to the isolation film;

etching the antireflective film, the isolation film, and the substrate by using the photosensitive film pattern as an etching mask to form a recess in the active region;

performing a light etch treatment on a substrate resultant without removing the remaining photosensitive film pattern, so as to remove a damaged layer and a carbon pollutant formed on a surface of the recessed active region; and removing the remaining photosensitive film pattern and the antireflective film, wherein the light etch treatment is performed by utilizing a gas not containing a carbon source, wherein the light etch treatment is performed by utilizing a gas of $SF_6$, $NF_3$, $Cl_2$ and HBr as a main etching gas.

2. A method of manufacturing a semiconductor device to form a STAR (step-gated asymmetry recess) cell, comprising the steps of:

forming an isolation film on a silicon substrate to define an active region;

forming an antireflective film on an entire surface of the substrate containing the isolation film;

forming a photosensitive film pattern on the antireflective film while exposing a portion of the isolation film or the active region adjacent to the isolation film;

etching the antireflective film, the isolation film, and the substrate by using the photosensitive film pattern as an etching mask to form a recess in the active region;

performing a light etch treatment on a substrate resultant without removing the remaining photosensitive film pattern, so as to remove a damaged layer and a carbon pollutant formed on a surface of the recessed active region; and removing the remaining photosensitive film pattern and the antireflective film, wherein the light etch treatment is performed by utilizing a gas not containing a carbon source, wherein the light etch treatment is performed by utilizing $CF_4$ as a main etching gas and any one of $O_2$, Ar, $N_2$ and $H_2$ as a dilute gas, while applying a low power lower than 100 W.

3. The method of claim 2, wherein the dilute gas consists essentially of $O_2$ or Ar.

4. The method of claim 2, wherein the dilute gas includes $O_2$ and Ar.

5. The method of claim 2, wherein the dilute gas includes $N_2$ and $H_2$.

6. A method of manufacturing a semiconductor device, the method comprising:

forming an isolation structure over a semiconductor substrate to define an active region on the substrate;

forming an antireflective film over the isolation structure and the active region;

forming a photosensitive film pattern over the antireflective film exposing a first portion of the antireflective film directly overlying a second portion of the isolation film and a third portion of the active region adjacent to the isolation structure;

etching the exposed first portion of the antireflective film to expose the second portion of the isolation structure and the third portion of the active region;

etching the exposed second portion of the isolation structure and the exposed third portion of the active region to form a recess having a step defined by the etching of the first portion of the isolations structure and the second portion of the active region;

performing a light etch treatment on the substrate including the recess without removing the photosensitive film pattern, so as to remove a damaged layer and a carbon pollutant formed on a surface of the etched second portion of the active region; and thereafter, removing the photosensitive film pattern and the antireflective film.

7. The method of claim 6, wherein the recess having a step defining a step-gated asymmetry recess.

8. The method of claim 7, wherein the light etch treatment is performed by utilizing a gas not containing a carbon source.

9. The method of claim 7, wherein the light etch treatment is performed by utilizing a main etching gas including $CF_4$ and a dilute gate including at least one selected from the group consisting of $O_2$, Ar, $N_2$, $H_2$, and a combination thereof.

10. The method of claim 9, wherein the light etch treatment is performed by applying a power of no more than 100 W.

11. The method of claim 7, wherein the light etching treatment is performed by utilizing a gas of $SF_6$, $NF_3$, $Cl_2$ and HBr as a main etch gas.

12. The method of claim 7, wherein the etching-the-exposed-first-portion step, the etching-of-the-second-portion step, and the performing-a-light-etch-treatment step are all performed in-situ.

* * * * *